United States Patent [19]
Takahashi

[11] Patent Number: 5,577,002
[45] Date of Patent: Nov. 19, 1996

[54] SEMICONDUCTOR INTEGRATED CIRCUIT DEVICE IMPLEMENTED BY BIPOLAR AND FIELD EFFECT TRANSISTORS AND HAVING STABLE SENSE AMPLIFIER

[75] Inventor: Hiroyuki Takahashi, Tokyo, Japan

[73] Assignee: NEC Corporation, Tokyo, Japan

[21] Appl. No.: 528,556

[22] Filed: Sep. 15, 1995

Related U.S. Application Data

[62] Division of Ser. No. 311,869, Sep. 26, 1994.

[30] Foreign Application Priority Data

Sep. 29, 1993 [JP] Japan .................................. 5-268198

[51] Int. Cl.⁶ ........................................ G11C 7/00
[52] U.S. Cl. ............................ 365/226; 365/207
[58] Field of Search ........................... 365/189.11, 205, 365/207, 226; 327/51, 52

[56] References Cited

U.S. PATENT DOCUMENTS

| 4,811,292 | 3/1989 | Watanabe | 365/189.11 |
| 5,229,967 | 7/1993 | Nogle | 365/208 |

FOREIGN PATENT DOCUMENTS

0540441A2  5/1993  European Pat. Off. .

OTHER PUBLICATIONS

IEEE International Solid–State Circuits Conference; vol. 35, 1992, New York, pp. 212–286.

*Primary Examiner*—A. Zarabian
*Attorney, Agent, or Firm*—Sughrue, Mion, Zinn, Macpeak & Seas

[57] ABSTRACT

A semiconductor static random access memory device includes an address decoder unit and a memory cell array implemented by field effect transistors, a differential amplifier circuit having a pair of bipolar transistors for increasing a potential difference indicative of a read-out data bit and a level shift circuit operative to change a voltage range of a selecting signal supplied to a field effect activation transistor coupled between the common emitter node of the bipolar transistors for activating the differential amplifier circuit, and the level shift circuit has a field effect switching transistor and a bipolar transistor coupled in series and another field effect switching transistor coupled between the collector node and the base node of the bipolar transistor so as to make the source-to-drain voltage of the field effect activation transistor large, thereby allowing the field effect activation transistor to stably operate in the saturated range.

3 Claims, 7 Drawing Sheets

SEMICONDUCTOR INTEGRATED CIRCUIT DEVICE IMPLEMENTED BY BIPOLAR AND FIELD EFFECT TRANSISTORS AND HAVING STABLE SENSE AMPLIFIER

This is a divisional of application Ser. No. 08/311,869, filed Sep. 26, 1994 pending.

FIELD OF THE INVENTION

This invention relates to a semiconductor integrated circuit device and, more particularly, to a bi-MOS implementation of a semiconductor integrated circuit device having a stable sense amplifier.

DESCRIPTION OF THE RELATED ART

Field effect transistors of semiconductor integrated circuit device have been miniaturized. The miniature field effect transistors are much liable to be damaged by large electric field strength, and a semiconductor integrated circuit device is equipped with an internal step-down power supply system for preventing the miniature transistors from damage.

A typical example of the semiconductor integrated circuit device is a semiconductor static random access memory device, and parts of the semiconductor static random access memory device are replaced with bipolar circuits for accelerating the access speed.

FIG. 1 illustrates an essential part of the prior art semiconductor static random access memory device, and a sense amplifier unit 1 is accompanied with a level shift circuit 2. Although static memory cells and row and column address decoders (not shown) are implemented by miniature field effect transistors, bipolar transistors QB1, QB2, QB3 and QB4 are used as essential circuit components of the sense amplifier unit 1, because the bipolar transistors QB1 to QB4 can increase an extremely small potential difference produced by the miniature field effect transistors at high speed.

The sense amplifier unit 1 is broken down into a differential amplifier circuit 1a electrically connected to a digit line pair and a cascade amplifier 1b coupled to an input and output circuit (not shown), and a read data bus lines RB and RBB connect the differential amplifier circuit 1a and the cascade amplifier circuit 1b.

The bipolar transistors QB1 and QB2 and an n-channel enhancement type switching transistor Qn1 form the differential amplifier circuit 1a. The collector nodes of the bipolar transistors QB1 and QB2 are respectively coupled to the read data bus lines RBB and RB, and the digit lines supply an extremely small potential difference to the base nodes of the bipolar transistors QB1 and QB2. The n-channel enhancement type switching transistor Qn1 has a drain-to-source path from the common emitter node of the bipolar transistors QB1 and QB2 and an internal negative power voltage line VEEM.

The cascade amplifier circuit 1b comprises two series combinations of resistors R1/R2 and the bipolar transistors QB3/QB4 coupled between a ground voltage line GND and the read data bus lines RBB and RB and a diode D1 coupled between the ground voltage line GND and the base nodes of the bipolar transistors QB3 and QB4. The collector nodes of the bipolar transistors QB3 and QB4 are coupled through output data lines SO and SOB to an input and output circuit (not shown).

The address decoder (not shown) activates the sense amplifier unit 1 with a selecting signal YA. As described above, the address decoder is implemented by the field effect transistors, and swings the selecting signal YA in a voltage range hereinbelow referred to as "decoder logic range". On the other hand, the n-channel enhancement type switching transistor Qn1 is associated with the bipolar transistors QB1 and QB2, and the bipolar transistors QB1 to QB4 swing the output data lines SO and SOB in a different voltage range from the decoder logic range. For this reason, the level shift circuit 2 changes the selecting signal YA from the decoder logic range to an appropriate voltage range for the n-channel enhancement type switching transistor Qn1. The voltage range for the n-channel enhancement type switching transistor Qn1 is hereinbelow referred to as "sense amplifier selection range" and the selecting signal in the sense amplifier selection range is labeled with YS.

The level shift circuit 2 comprises a complementary inverter, i.e., a series of a p-channel enhancement type switching transistor Qp2 and an n-channel enhancement type switching transistor Qn3 coupled between the ground voltage line GND and the internal negative power voltage line VEEM and an inverter, i.e., a series of n-channel enhancement type switching transistors Qn4 and Qn5 coupled between an internal negative power voltage line VB and the internal negative power voltage line VEEM.

The ground voltage level GND and an external negative power voltage VEE at −4.5 volts are supplied from the outside to the prior art semiconductor static random access memory device, and power voltage generators 3 and 4 produce the internal negative power voltage levels VEEM and VB from the external negative power voltage VEE as shown in FIG. 2. In this instance, the internal negative power voltage level VEEM is regulated to −3.5 volts.

Description is hereinbelow made on the circuit behavior of the level shift circuit 2 and the sense amplifier unit 1. Assuming now the address decoder changes the selecting signal YA from the high level to the low level, the p-channel enhancement type switching transistor Qp2 turns on, and the n-channel enhancement type switching transistor Qn3 turns off. Then, the ground voltage level is supplied to the gate electrode of the n-channel enhancement type switching transistor Qn4, and the low voltage level VEEM is directly supplied to the gate electrode of the n-channel enhancement type switching transistor Qn5. As a result, the n-channel enhancement type switching transistor Qn4 turns on, and the other n-channel enhancement type switching transistor Qn5 turns off. Then, the internal negative power voltage VB is supplied to the gate electrode of the n-channel enhancement type switching transistor Qn1.

The n-channel enhancement type switching transistor Qn1 turns on, and the differential amplifier circuit 1a is activated for increasing a potential difference on the digit line pair. Namely, the n-channel enhancement type switching transistor Qn1 couples the common emitter node of the bipolar transistors QB1 and QB2 to the internal negative power voltage level VEEM, and the bipolar transistors QB1 and QB2 produces a larger potential difference on the read data bus lines RB and RBB.

The potential difference on the read data bus lines RB and RBB makes the emitter-base differential voltage of the bipolar transistor QB3 different from the emitter-base differential voltage of the bipolar transistor QB4, and, accordingly, difference takes place between the collector current of the bipolar transistor QB3 and the collector current of the bipolar transistor QB4. As a result, a large potential difference is produced between the output data lines SO and SOB, and the small potential difference on the digit line pair is transferred through the amplification to the output data lines SO and SOB.

If the selecting signal is recovered from the low level to the high level, the p-channel enhancement type switching transistor Qp2 turns off, and the n-channel enhancement type switching transistor Qn3 turns on. Then, the internal negative power voltage VEEM is supplied through the n-channel enhancement type switching transistor Qn3 to the gate electrode of the n-channel enhancement type switching transistor Qn4, and the n-channel enhancement type switching transistor Qn4 turns off. On the other hand, the selecting signal YA of the high level allows the n-channel enhancement type switching transistor Qn5 to turn on, and the internal negative power voltage VEEM is supplied through the n-channel enhancement type switching transistor Qn5 to the gate electrode of the n-channel enhancement type switching transistor Qn1. As a result, the n-channel enhancement type switching transistor Qn1 turns off, and the sense amplifier unit 1 terminates the differential amplification. The address decoder selects another sense amplifier unit (not shown) for outputting another data bit.

A problem is encountered in stability of the sense amplification, and the potential difference between the output data lines SO and SOB fluctuates.

SUMMARY OF THE INVENTION

It is therefore an important object of the present invention to provide a semiconductor integrated circuit device which has a stable sense amplifier unit.

The present inventor contemplated the prior art problem, and noticed that the n-channel enhancement type switching transistor Qn1 was operating in the vicinity of a boundary between the saturation range and the linear range of a field effect transistor. In detail, while the sense amplifier unit 1 was being activated, the common emitter node and, accordingly, the drain node of the n-channel enhancement type switching transistor Qn1 were lower than the ground voltage by three times of the forward bias voltage across the p-n junction, i.e., about −2.4 volts. The source voltage was −3.5 volts, and the drain voltage was −2.4 volts. Then, only 1 volt was left between the source node and the drain node of the n-channel enhancement type switching transistor.

To accomplish the object, the present invention proposes to enlarge a voltage difference between the source node and the drain node of an activation field effect transistor.

In accordance with the present invention, there is provided a semiconductor integrated circuit device comprising: a) a first circuit for forming a first potential difference; b) a second circuit implemented by field effect transistors, and responsive to a first signal for changing a second signal between a first voltage level and a second voltage level; c) a differential amplifier circuit having first and second bipolar transistors arranged in parallel, and responsive to the first potential difference for producing a second potential difference between the collector nodes thereof, and a first field effect transistor coupled between a common emitter node of the first and second bipolar transistors and a source of third voltage level, and responsive to a third signal for activating the first and second bipolar transistors; and d) a level shift circuit having an inverter coupled between a source of fourth voltage level and the source of third voltage level, and responsive to the second signal for changing the third signal between the third voltage level and the fourth voltage level, the first voltage level and the third voltage level having the minimum absolute value and the maximum absolute value, the second voltage level having an absolute value closer to the third voltage level than the fourth voltage level.

The first circuit and the second circuit may be a memory cell array and an address decoder unit.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 1:
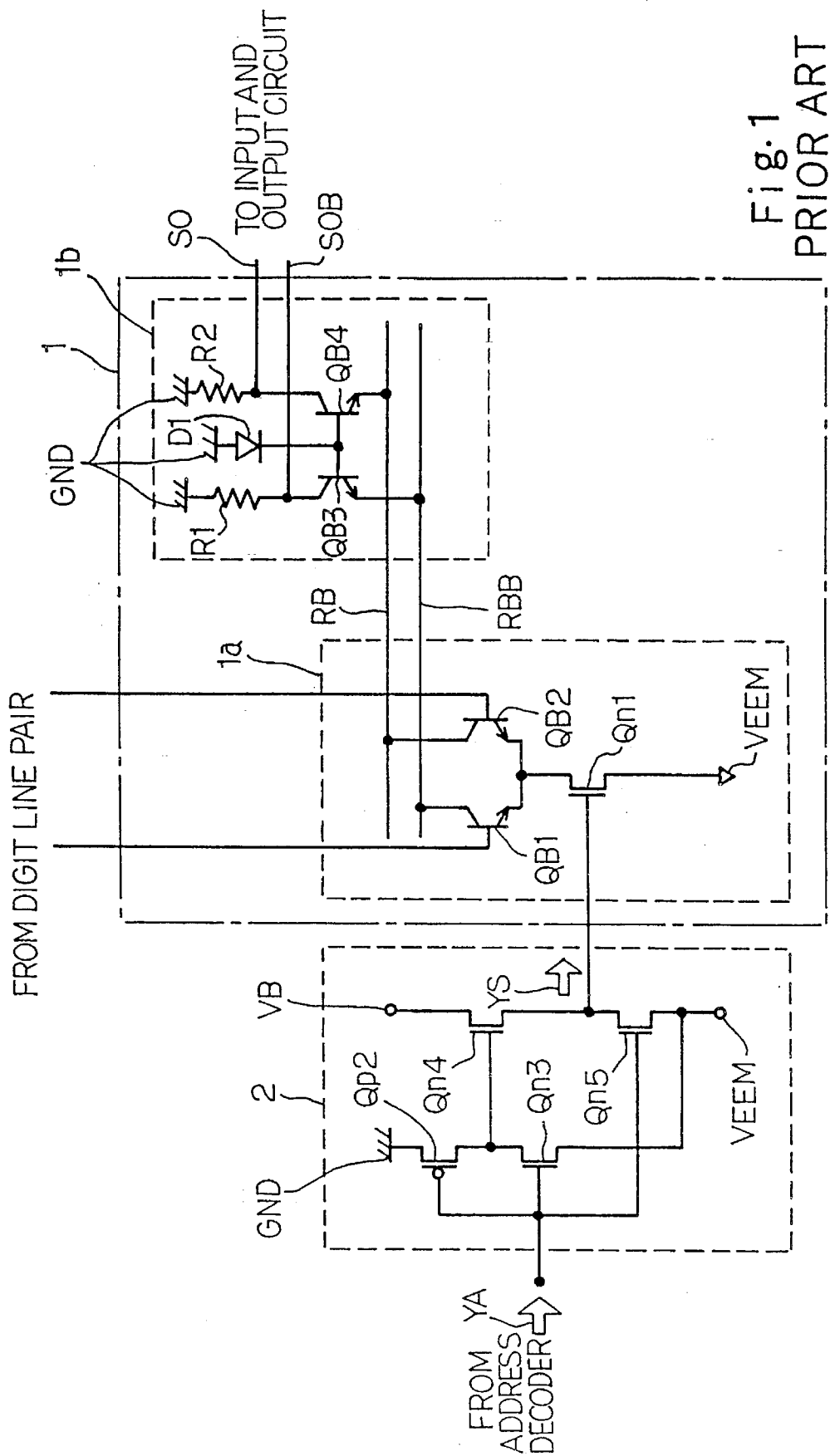
FIG. 1 is a circuit diagram showing the sense amplifier unit accompanied with the level shift circuit incorporated in the prior art semiconductor static random access memory device.
Figure 2:
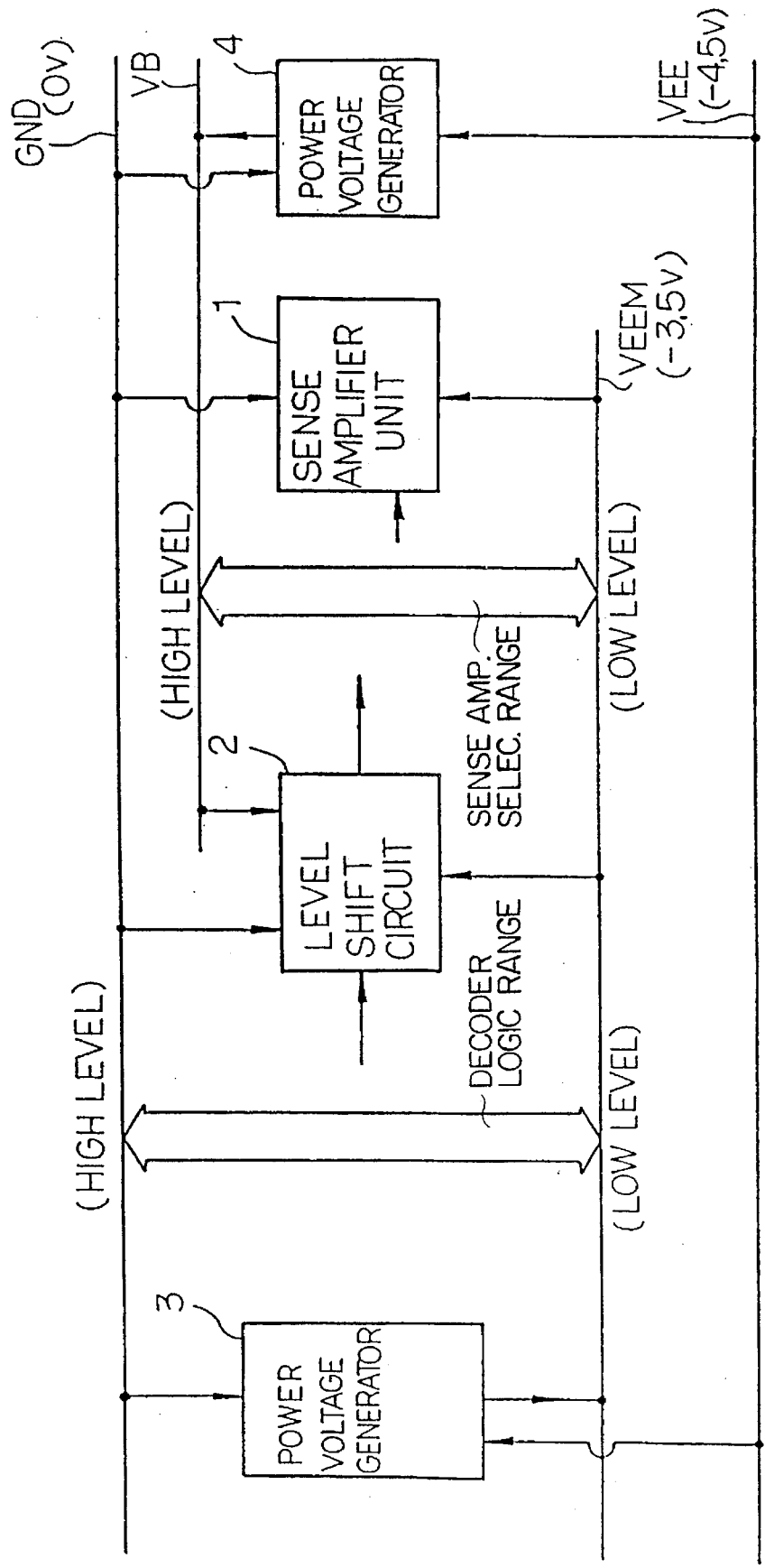
FIG. 2 is a block diagram showing the power supply system incorporated in the prior art semiconductor static random access memory device.
Figure 3:
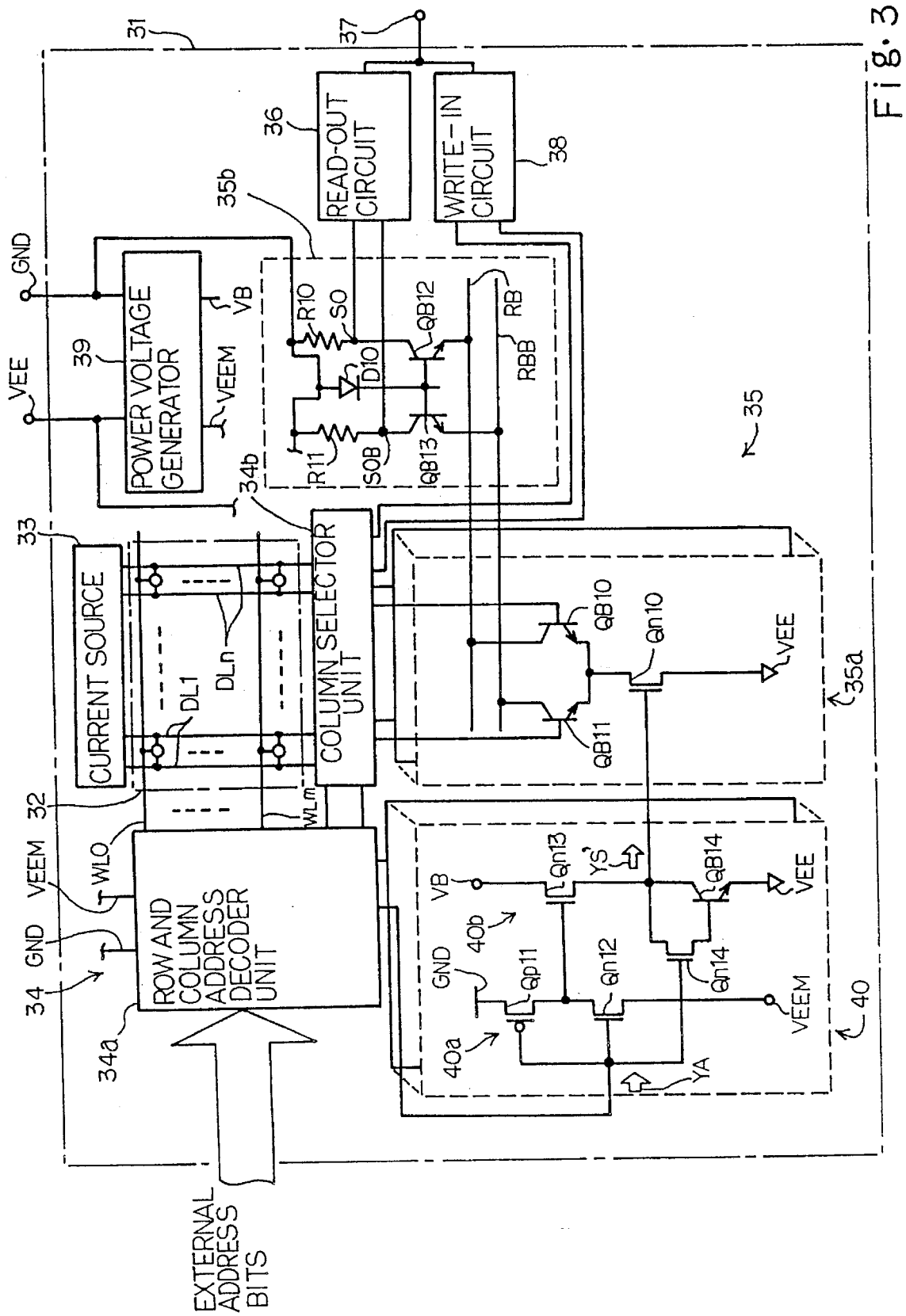
FIG. 3 is a circuit diagram showing parts of a semiconductor static random access memory device according to the present invention.

Referring to FIG. 3 of the drawings, a semiconductor static random access memory device embodying the present invention is fabricated on a semiconductor chip 31, and comprises a memory cell array 32 implemented by a plurality Of static memory cells arranged in rows and columns. Each of the static memory cells may be a flip flop circuit with a pair of memory nodes, and a data bit is stored in the form of potential difference between the memory nodes. The static memory cells are represented by small circles.

A plurality of word lines WL0 to WLm are respectively associated with the rows of static memory cells, and the columns of static memory cells are coupled to a plurality of digit line pairs DL0 to DLn, respectively. When one of the word lines WL0 to WLm is energized, the digit line pairs DL0 to DLn are electrically connected to the pairs of memory nodes of the associated row of static memory cells, respectively.

A current source 33 is connected to the digit line pairs DL0 to DLn, and charges and equalizes the digit line pairs DL0 to DLn before the selection with the word lines WL0 to WLm. The current source 33 forms a part of the semiconductor static random access memory device.

The semiconductor static random access memory device further comprises an addressing system 34, and the addressing system 34 has a row and column address decoder unit 34a and a column selector unit 34b. The row and column address decoder unit 34a is responsive to external address bits indicative of a row address and a column address. The row and column address decoder unit 34a selectively energizes the word lines WL0 to WLm assigned the row address, and selectively couples the digit line pairs DL0 to DLn to a sense amplifier unit 35.

In this instance, miniature field effect transistors form the static memory cells, the current source 33, and the addressing system 34.

The sense amplifier unit 35 forms a part of the semiconductor static random access memory device, and comprises a plurality of differential amplifier circuits 35a connected to the column selector unit 34b, a read data bus lines RB and RBB shared between the plurality of differential amplifier circuits 35a and a cascade amplifier circuit 35b coupled between the read data bus lines RB and RBB and a read-out circuit 36. The read-out circuit 36 is incorporated in the semiconductor static random access memory device, and is implemented by emitter coupled logic circuits.

The plurality of sense amplifier circuits 35a are similar in circuit configuration to one another, and each sense amplifier circuit 35a comprises bipolar transistors QB10 and QB11 having respective collector nodes coupled to the data bus lines RB and RBB and an n-channel enhancement type switching transistor Qn10 coupled between the common emitter node of the bipolar transistors QB10 and QB11 and a negative power voltage line VEE. One of the potential differences on the digit line pairs DL0 to DLn is transferred through the column selector unit 34b to the gate electrodes of the bipolar transistors QB10 and QB11 incorporated in one of the differential amplifier circuits 35a.

The cascade amplifier circuit 35b comprises two series combination of resistors R10 and R11 and bipolar transistors QB12 and QB13 coupled between a ground voltage line GND and the read-out data bus lines RB and RBB and a diode D10 coupled between the ground voltage line GND and the base nodes of the bipolar transistors QB12 and QB13. The collector nodes SO and SOB of the bipolar transistors QB12 and QB13 are connected to the read-out circuit 36, and the read-out circuit produces an output data signal from the potential difference between the collector nodes SO and SOB of the bipolar transistors QB12 and QB13. The output data signal is delivered from a data port 37 to a destination (not shown).

The semiconductor static random access memory device further comprises a write-in circuit 38 coupled between the data port 37 to the column selector unit 34b, and the write-in circuit 38 supplies a potential difference indicative of a write-in data bit through the column selector unit 34b to one of the digit line pairs DL0 to DLn.

Figure 4:
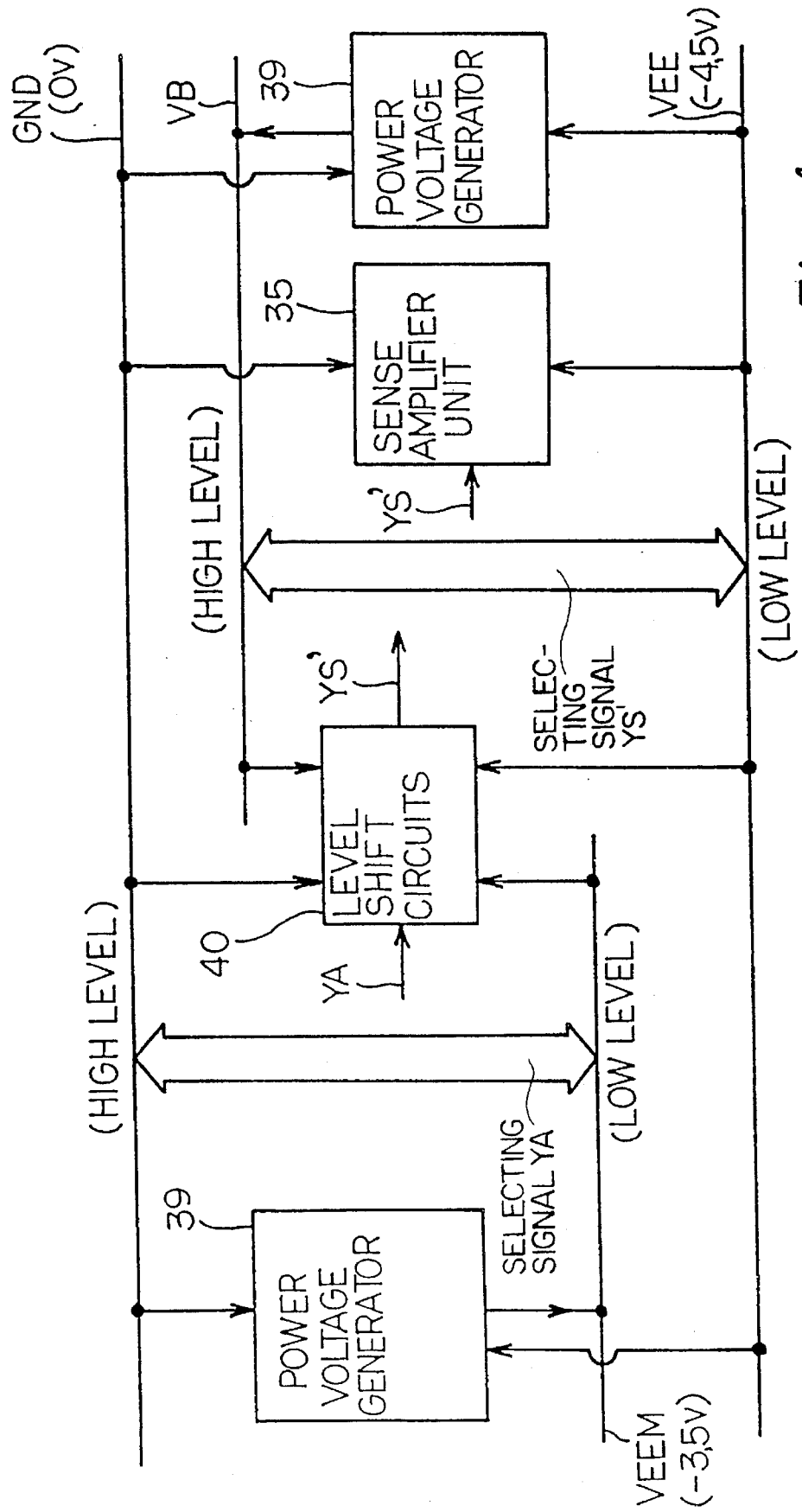
FIG. 4 is a block diagram showing a power supply system incorporated in the semiconductor static random access memory device.

The semiconductor static random access memory device further comprises a power voltage generator 39 which form parts of a power supply system shown in FIG. 4. The ground voltage and an external power voltage of −4.5 volts are supplied from power supply pins GND and VEE to the power voltage generator 39, and the power voltage generator 39 produces internal negative power voltages VEEM and VB from these external power voltages. The ground voltage and the external power voltage VEE are further supplied to the ground voltage line GND and the negative power voltage line VEE, and the negative power voltage at −4.5 volts and the ground voltage are also labeled with "VEE" and "GND", respectively. In this instance, the negative power voltage VEEM is −3.5 volts, and the other negative power voltage VB is regulated to a certain level appropriate for controlling the differential amplifier circuits 35a.

Turning back to FIG. 3, the semiconductor static random access memory device further comprises a plurality of level-shift circuits 40 similar in circuit configuration to one another. Each of the level-shift circuits 40 comprises a complementary inverter 40a coupled between the ground voltage line GND and a negative power voltage line VEEM and an inverter 40b coupled between another negative power voltage line VB and the negative power voltage line VEE.

The complementary inverter 40a is implemented by a series of p-channel enhancement type switching transistor Qp11 and an n-channel enhancement type switching transistor Qn12. A selecting signal YA is supplied from the row and column address decoder unit 34a to the gate electrode of the p-channel enhancement type switching transistor Qp11 and the gate electrode of the n-channel enhancement type switching transistor Qn12.

The inverter 40b comprises a series combination of an n-channel enhancement type switching transistor Qn13 and a bipolar transistor QB14 coupled between yet another negative power voltage line VB and the negative power voltage line VEE. An n-channel enhancement type switching transistor Qn14 is coupled between the collector node and the base electrode of the bipolar transistor QB14. The n-channel enhancement type switching transistor Qn14 is directly gated by the selecting signal YA, and produces a gate control signal for the bipolar transistor QB14. The n-channel enhancement type switching transistor Qn13 and the bipolar transistor QB14 complementarily turn on and off, and produces a selecting signal YS' for the associated differential amplifier circuit 35a. The row and column address decoder unit 34a swings the selecting signal YS between the ground voltage level and the negative power voltage level VEEM as similar to the prior art. However, the level shift circuit 40 changes the selecting signal YS' between the negative power voltage level VB and the negative power voltage level VEE, and the amplitude of the selecting signal YS' is wider than the selecting signal YS by about 1 volt.

The bipolar transistor QB14 expands the amplitude of the selecting signal YS', and the wide-amplitude selecting signal YS' allows the sense amplifier unit 35 to operate between the ground voltage level GND and the negative power voltage level VEE.

In detail, assuming now that the inverter Qn4/Qn5 of the prior art level shift circuit 2 is coupled between the negative power voltage line VB and the negative power voltage line VEE, the selecting signal YA of the high level, i.e., the ground voltage level causes the n-channel enhancement type switching transistors Qn3 and Qn5 to turn on, and the negative power voltage line VEEM and the negative power voltage line VEE are connected to the common drain node of the p-channel enhancement type switching transistor Qp2 and the n-channel enhancement type switching transistor Qn3 and the common drain node of the n-channel enhancement type switching transistors Qn4 and Qn5, respectively. The common drain node between the p-channel enhancement type switching transistor Qp2 and the n-channel enhancement type switching transistor Qn3 is closer to the ground voltage level than the common drain nodes of the n-channel enhancement type switching transistors Qn4 and Qn5 due to the difference between the negative power voltage levels VEE and VEEM. As a result, the n-channel enhancement type switching transistor Qn4 tends to turn on, and through-current flows from the negative power voltage line VB and the negative power voltage line VEE.

However, when the bipolar transistor QB14 is coupled between the source node and the drain node of the n-channel enhancement type switching transistor Qn14 as shown in FIG. 3, a voltage level Von for concurrent turn-on of the n-channel enhancement type switching transistors Qn13 and Qn14 is increased as $$Von=VEE+Vf+Vth=VEE+1.8 \ (volt)$$

where Vf is the forward bias voltage between the emitter and the base and Vth is the threshold of the n-channel enhancement type switching transistors Qn13 and Qn14. As described hereinbefore, the selecting signal YA is changed between the ground voltage level and the negative power voltage level VEEM only 1-volt higher than the negative power voltage level VEE, and, for this reason, no through-current flows between the negative power voltage line VB and the negative power voltage line VEE. In other words, the inverter 40b exactly changes the selecting signal YS' between the negative power voltage level VB and the negative power voltage level VEE.

Moreover, a bipolar transistor QB14 larger in current driving capability than an n-channel enhancement type switching transistor, and the level shift circuit 40 accelerates the differential amplification of the amplifier circuit 35a.

Figure 5:
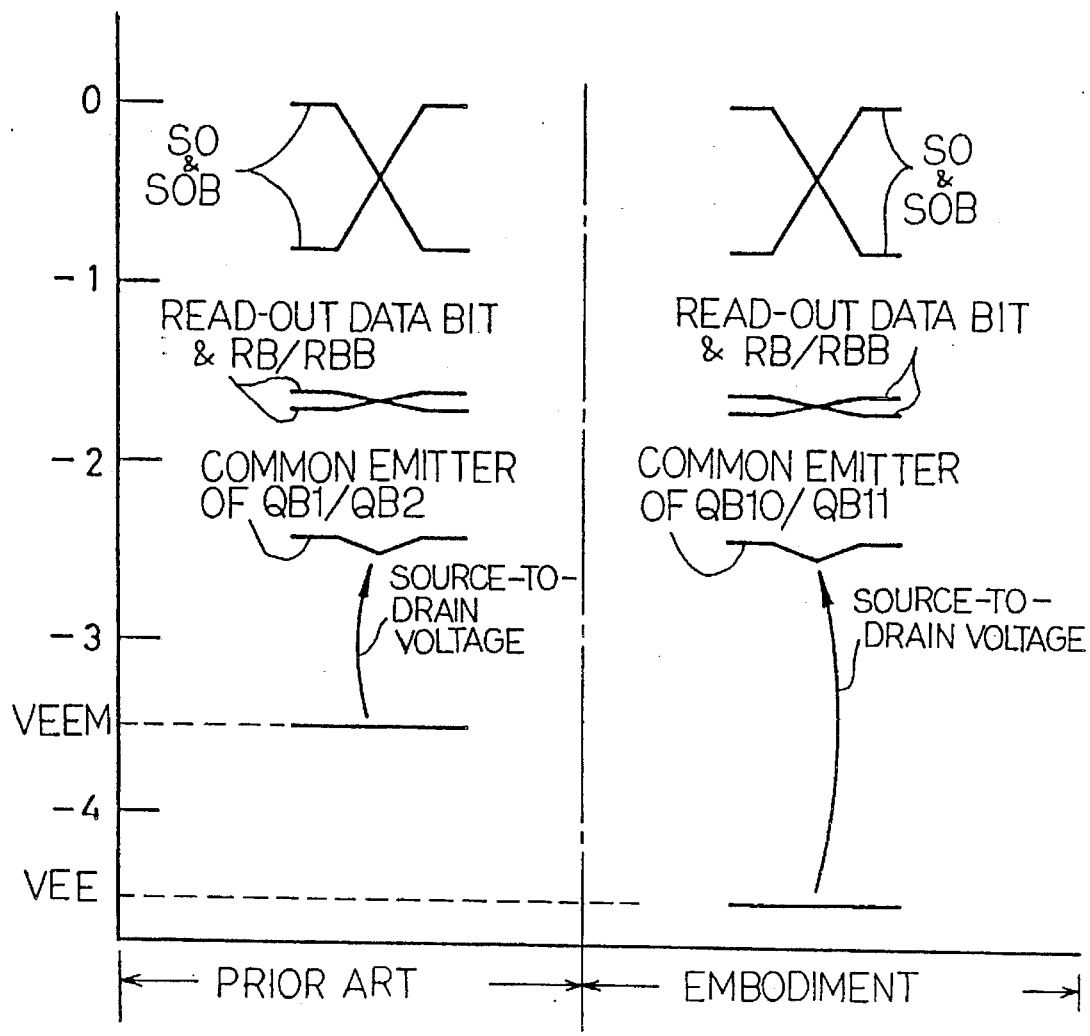
FIG. 5 is a graph showing waveforms at essential nodes incorporated in the semiconductor static random access memory device in comparison with the corresponding waveforms of the prior art semiconductor static random access memory device.

Description is briefly made on a read-out sequence with reference to FIG. 5 of the drawings. Although the semiconductor static random access memory device stores new data bits in the memory cell array 32 through a write-in sequence, the write-in operation does not directly relate to the present invention, and no description is made on the write-in sequence.

When the external address bits are supplied to the row and column address decoder unit 34a, one of the word lines WL0 to WLm is energized, and the associated static memory cells produce potential differences on the bit line pairs DL0 to DLn. The column selector unit 34b connects selected digit line pairs to the differential amplifier circuits 35a, and the row and column address decoder unit 34a sequentially activates the differential amplifier circuits 35a.

The row and column address decoder unit 34a is assumed to firstly change the selecting signal YA from the ground voltage level GND to the negative power voltage level VEEM. The p-channel enhancement type switching transistor Qp11 turns on, and the n-channel enhancement type switching transistors Qn12 and Qn14 turn off. Then, the ground voltage GND is supplied through the p-channel enhancement type switching transistor Qp11 to the gate electrode of the n-channel enhancement type switching transistor Qn13, and the level shift circuit 40 changes the selecting signal YS' to the negative high voltage level VB.

Then, the n-channel enhancement type switching transistor Qn10 turns on, and the differential amplifier circuit 35a is activated for the sense amplification. The potential difference indicative of the read-out data bit makes the collector currents of the bipolar transistors QB10 and QB11 different, and the bipolar transistors QB10 and QB11 produces a potential difference between the read-out bus lines RB and RBB.

While the bipolar transistors QB10 and QB11 are producing the potential difference between the read-out bus lines RB and RBB, the n-channel enhancement type switching transistor Qn10 is stable, because the n-channel enhancement type switching transistor Qn10 is operating in the saturated or constant current range due to the large source-to-drain voltage as seen in FIG. 5.

The potential difference between the read-out bus lines RB and RBB causes the bipolar transistors QB12 and QB13 to have different base-emitter bias voltages and, accordingly, different collector currents. For this reason, the resistors R10 and R11 produce a large potential difference between the collector nodes SO and SOB, and the read-out circuit 36 converts the potential difference between the collector nodes SO and SOB to the output data signal.

Subsequently, the row and column address decoder unit 34a changes the selecting signal YA to the ground voltage level GND, and the p-channel enhancement type switching transistor Qp11 turns off. The n-channel enhancement type switching transistors Qn12 and Qn14 turn on, and the negative power voltage level VEEM is supplied through the n-channel enhancement type switching transistor Qn12 to the gate electrode of the n-channel enhancement type switching transistor Qn13. As a result, the selecting signal YS' is decayed toward the negative power voltage level VEE, and the selecting signal YS' causes the n-channel enhancement type switching transistor Qn10 to turn off.

The row and column address decoder unit 34a changes another selecting signal for another differential amplifier circuit 35a.

In this instance, the memory cell array 32 and the row and column address decoder unit 34a serve as a first circuit and a second circuit, respectively, and the ground voltage level GND, the negative power voltage level VEEM, the negative power voltage level VEE and the negative power voltage level VB are a first voltage level, a second voltage level, a third voltage level and a fourth voltage level, respectively. The external address bits serve as a first signal, and the selecting signals YA and YS' respectively serve as a second signal and a third signal.

As will be appreciated from the foregoing description, the selecting signal YS' is widely changed, and makes the source-to-drain voltage of the n-channel enhancement type switching transistor Qn10 large. As a result, the n-channel enhancement type switching transistor Qn10 is operating in the saturated range, and the differential amplifier circuit 35a produces the stable potential difference between the read-out bus lines RB and RBB.

Second Embodiment

Figure 6:
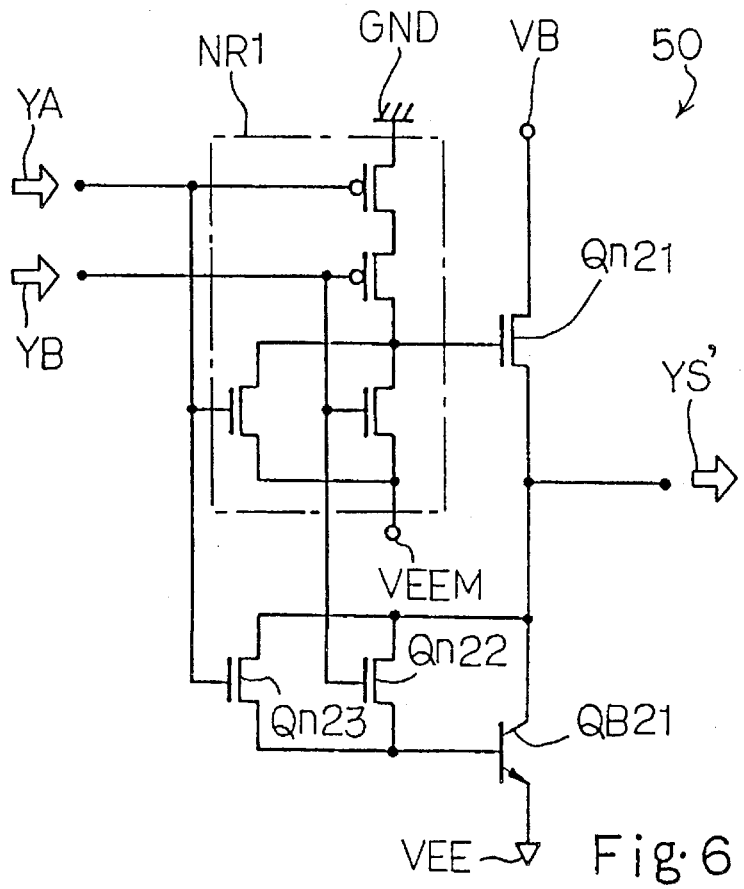
FIG. 6 is a circuit diagram showing a level shift circuit incorporated in another semiconductor static random access memory device according to the present invention.

Turning to FIG. 6 of the drawings, a level shift circuit incorporated in another semiconductor static random access memory device embodying the present invention comprises a NOR gate NR1 responsive to two-bit activation signal YA/YB, a series of an n-channel enhancement type switching transistor Qn21 and a bipolar transistor QB21 coupled between the negative power voltage lines VB and VEE and a parallel of n-channel enhancement type switching transistors Qn22 and Qn23 coupled between the collector node and the base node of the bipolar transistor QB21. The other configuration of the semiconductor static random access memory device are similar to those of the first embodiment, and detailed description is omitted for the sake of simplicity.

The level shift circuit 50 achieves a NOR operation on the tow bits YA and YB, and changes the selecting signal YS' as similar to the first embodiment.

Thus, the level shift circuit 50 achieves the NOR operation, and the row and column address decoder unit of the second embodiment becomes simpler than that of the first embodiment.

The NOR configuration is changeable into a NAND configuration.

Third Embodiment

Figure 7:
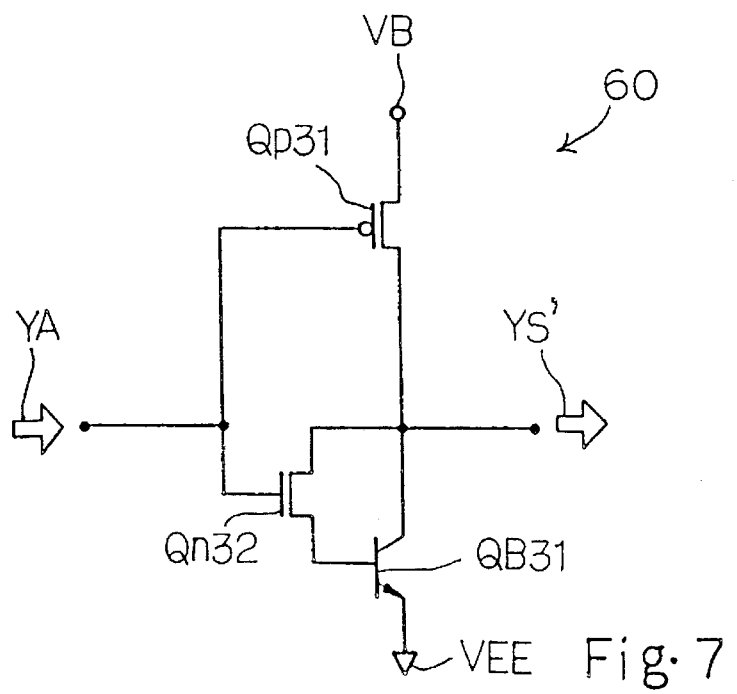
FIG. 7 is a circuit diagram showing a level shift circuit incorporated in yet another semiconductor static random access memory device according to the present invention.

Turning to FIG. 7 of the drawings, a level shift circuit incorporated in yet another semiconductor static random access memory device comprises a complementary inverter only. The complementary inverter has a p-channel enhancement type switching transistor Qp31, a bipolar transistor QB31 and an n-channel enhancement type switching transistor Qn32. Comparing the complementary inverter with the inverter 40b, the n-channel enhancement type switching transistor Qn13 is replaced with the p-channel enhancement type switching transistor Qp31, and the p-channel enhancement type switching transistor Qp31 is directly gated by the selecting signal YA. The difference between the low level of the selecting signal YA and the negative power voltage level VB is usually greater than the threshold of the p-channel enhancement type switching transistor Qp31, and the level shift circuit 60 is simpler than the first and second embodiments. This results in reduction of the semiconductor chip size.

Figure 8:
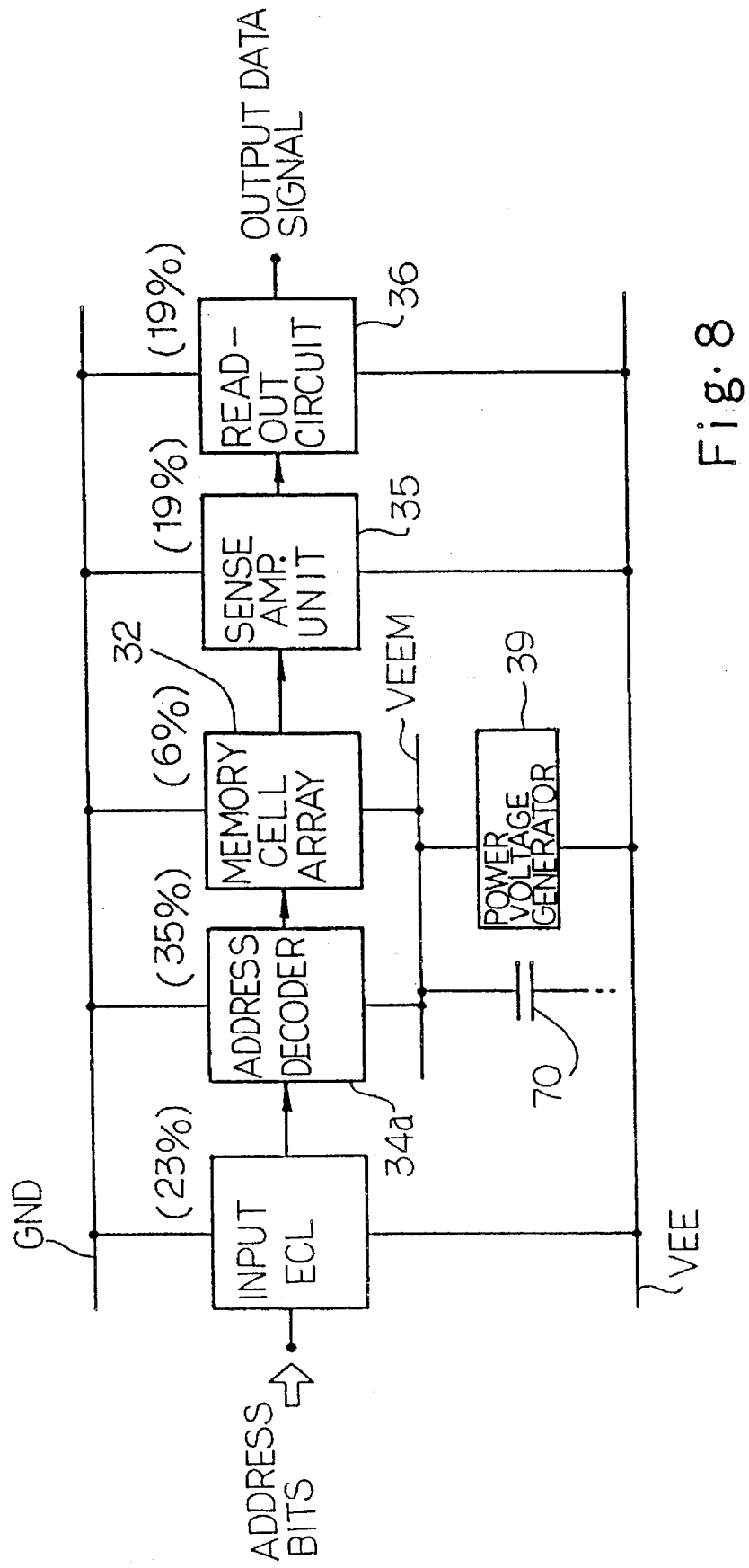
FIG. 8 is a block diagram showing power consumption of the component units incorporated in a semiconductor static random access memory device.

FIG. 8 illustrates a power supplying system and a power consumption ratio between component units. According to the present invention, the sense amplifier unit 35 does not consume the negative power voltage level VEEM, and decreases the load of the power voltage generator 39 at about 20 per cent. This means that the amount of current for the power voltage generator 39 is decreased at 30 per cent or more, and a capacitor 70 for stabilizing the negative power voltage level VEEM is decreased in size.

Although particular embodiments of the present invention have been shown and described, it will be obvious to those skilled in the art that various changes and modifications may be made without departing from the spirit and scope of the present invention. For example, the present invention may pertain to any bi-MOS integrated circuit device equipped with the sense amplifier unit, and the semiconductor static random access memory device may form a part of an ultra large scale integration together with other function blocks.

Moreover, the external/internal power voltage levels of the embodiment do not set a limitation to the present invention. The selecting signal YA may be replaced with an activation signal produced by a timing generator.

What is claimed is:

1. A semiconductor memory device comprising:

a cell array;

a sense amplifier receiving data from said cell array and responsive to an activation signal for amplification;

a voltage supplying section supplied with a first power voltage and a second power voltage for producing a first internal voltage and a second internal voltage each of which is different from said first power voltage and said second power voltage;

an address decoder supplied with said first power voltage and said first internal voltage, and responsive to an address signal for producing a selecting signal having a voltage level which changes in a first voltage range determined by said first power voltage and said first internal voltage; and an activation control section supplied with said second power voltage and said second internal voltage, and responsive to said selecting signal for producing said activation signal having a voltage level which changes in a second voltage range determined by said second power voltage and said second internal voltage.

2. The semiconductor memory device of claim 1, wherein said first power voltage has a minimum absolute value compared with an absolute value for each of said second power voltage and said first and second internal voltages, and said second power voltage has a maximum absolute value compared with an absolute value for each of said first and second internal voltages.

3. The semiconductor memory device of claim 2, wherein said first internal voltage has an absolute value closer to said second power voltage than to said first power voltage and said second internal voltage has an absolute value closer to said first power voltage than to said second power voltage.

\* \* \* \* \*